(12) United States Patent
Jo

(10) Patent No.: US 10,840,442 B2
(45) Date of Patent: Nov. 17, 2020

(54) NON-STOICHIOMETRIC RESISTIVE SWITCHING MEMORY DEVICE AND FABRICATION METHODS

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 15/159,135

(22) Filed: May 19, 2016

(65) Prior Publication Data
US 2016/0343937 A1  Nov. 24, 2016

Related U.S. Application Data

(60) Provisional application No. 62/165,874, filed on May 22, 2015.

(51) Int. Cl.
    H01L 45/00   (2006.01)
(52) U.S. Cl.
    CPC .............. *H01L 45/08* (2013.01); *H01L 45/12* (2013.01); *H01L 45/1233* (2013.01); *H01L 45/145* (2013.01); *H01L 45/1625* (2013.01)
(58) Field of Classification Search
    None
    See application file for complete search history.

(56) References Cited

U.S. PATENT DOCUMENTS

| | | | |
|---|---|---|---|
| 5,627,451 A | 5/1997 | Takeda | |
| 6,861,356 B2 * | 3/2005 | Matsuse | ............ H01L 21/28061 257/E21.168 |
| 7,667,442 B2 | 2/2010 | Itoh | |
| 7,704,788 B2 | 4/2010 | Youn et al. | |
| 7,830,698 B2 | 11/2010 | Chen et al. | |
| 8,853,099 B2 | 10/2014 | Wang et al. | |
| 8,853,661 B1 | 10/2014 | Tendulkar et al. | |
| 8,872,246 B1 * | 10/2014 | Stevens | ................... H01L 45/08 257/2 |

(Continued)

FOREIGN PATENT DOCUMENTS

| | | |
|---|---|---|
| CN | 103280526 | 9/2013 |
| CN | 103682091 | 3/2014 |

(Continued)

OTHER PUBLICATIONS

Choi et al. "Nitride Memristors", Jul. 17, 2012, Applied Physics, pp. 1-4 (Year: 2012).*

(Continued)

*Primary Examiner* — Telly D Green
(74) *Attorney, Agent, or Firm* — Wegman Hessler

(57) ABSTRACT

Providing for a resistive switching memory device is described herein. By way of example, the resistive switching memory device can comprise a bottom electrode, a conductive layer, a resistive switching layer, and a top electrode. Further, two or more layers can be selected to mitigate mechanical stress on the device. In various embodiments, the resistive switching layer and conductive layer can be formed of compatible metal nitride or metal oxide materials having different nitride/oxide concentrations and different electrical resistances. Further, similar materials can mitigate mechanical stress on the resistive switching layer and a conductive filament of the resistive switching memory device.

11 Claims, 12 Drawing Sheets

(56) References Cited

U.S. PATENT DOCUMENTS

| | | | |
|---|---|---|---|
| 8,884,261 B2* | 11/2014 | Jo | G11C 13/0009 257/4 |
| 8,890,106 B2* | 11/2014 | Yang | H01L 21/77 257/2 |
| 9,275,728 B2 | 3/2016 | Srinivasan et al. | |
| 9,735,357 B2* | 8/2017 | Jo | H01L 45/146 |
| 2008/0019163 A1 | 1/2008 | Hoenigschmid et al. | |
| 2008/0128772 A1 | 6/2008 | Senzaki | |
| 2008/0247215 A1* | 10/2008 | Ufert | G11C 13/0007 365/148 |
| 2008/0278988 A1* | 11/2008 | Ufert | G11C 11/04 365/148 |
| 2008/0301497 A1 | 12/2008 | Chung et al. | |
| 2010/0237314 A1 | 9/2010 | Tsukamoto et al. | |
| 2011/0121359 A1 | 5/2011 | Yang et al. | |
| 2011/0204314 A1 | 8/2011 | Baek et al. | |
| 2011/0310656 A1 | 12/2011 | Kreupl et al. | |
| 2012/0008366 A1* | 1/2012 | Lu | G11C 13/0002 365/148 |
| 2012/0043519 A1* | 2/2012 | Jo | G11C 13/0009 257/4 |
| 2012/0074376 A1* | 3/2012 | Kumar | G11C 13/0007 257/4 |
| 2012/0252184 A1* | 10/2012 | Ninomiya | C23C 26/00 438/382 |
| 2013/0026438 A1* | 1/2013 | Wang | H01L 45/1233 257/4 |
| 2014/0014966 A1 | 1/2014 | Tabatabaie et al. | |
| 2014/0097397 A1* | 4/2014 | Park | H01L 45/04 257/4 |
| 2014/0158973 A1* | 6/2014 | Yang | H01L 27/101 257/4 |
| 2014/0166956 A1* | 6/2014 | Higuchi | H01L 45/1608 257/1 |
| 2014/0166957 A1* | 6/2014 | Yang | H01L 21/77 257/1 |
| 2014/0175357 A1* | 6/2014 | Nardi | H01L 45/146 257/2 |
| 2014/0185358 A1 | 7/2014 | Jo et al. | |
| 2014/0192589 A1* | 7/2014 | Maxwell | H01L 45/12 365/148 |
| 2014/0264236 A1* | 9/2014 | Kim | H01L 45/06 257/4 |
| 2014/0269002 A1* | 9/2014 | Jo | H01L 45/145 365/148 |
| 2014/0335675 A1* | 11/2014 | Narayanan | H01L 45/1608 438/382 |
| 2014/0361235 A1 | 12/2014 | Wang et al. | |
| 2015/0021538 A1* | 1/2015 | Jo | G11C 13/0009 257/2 |
| 2016/0225824 A1* | 8/2016 | Jo | H01L 45/1233 |
| 2017/0200494 A1* | 7/2017 | Ge | G11C 13/0007 |

FOREIGN PATENT DOCUMENTS

| | | |
|---|---|---|
| CN | 103999218 | 8/2014 |
| RU | 2011113573 | 10/2012 |

OTHER PUBLICATIONS

Choi et al. "Nitride Memristors", Apr. 2, 2013, MRS Spring Meeting, slides 1-19 (Year: 2013).*
Taiwanese Office Action for Taiwanese Patent Application No. 105103270 dated Jan. 18, 2017, 14 pages (including translation).
International Search Report and Written Opinion for International Application No. PCT/US2016/016391 dated Jun. 3, 2016, 10 pages.
Office Action for U.S. Appl. No. 15/012,530 dated Jan. 12, 2017, 63 pages.
Office Action for U.S. Appl. No. 15/012,530 dated Aug. 11, 2016, 54 pages.
Non-Final Office Action received for U.S. Appl. No. 15/676,231 dated Jun. 28, 2018, 75 pages.
First Office Action for corresponding Chinese Patent Application No. 201611042583.X dated Apr. 2, 2019, 8 pages.

* cited by examiner

NON-STOICHIOMETRIC RESISTIVE SWITCHING MEMORY DEVICE AND FABRICATION METHODS

RELATED APPLICATION

This non-provisional patent application claims the benefit of U.S. Provisional Patent Application No. 62/165,874, filed on May 22, 2015, and entitled "NON-STOCHASTIC RESISTIVE SWITCHING MEMORY DEVICE AND FABRICATION METHODS"; the entirety of this provisional application is hereby incorporated by reference herein for all purposes.

TECHNICAL FIELD

This disclosure relates generally to electronic memory, for example, the disclosure describes a resistive switching device configured to have a non-linear current-voltage response.

BACKGROUND

A recent innovation within the field of integrated circuit technology is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode, insulator, electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present disclosure provide a resistive switching memory device. In some embodiments, the resistive switching memory device can comprise a bottom electrode, a conductive layer, a resistive switching layer, and a top electrode. Further, two or more layers can be selected to mitigate mechanical stress on the device. In various embodiments, the resistive switching layer and conductive layer can be formed of compatible metal nitride or metal oxide materials having different electrical resistances, and that mitigate mechanical stress on the resistive switching layer and a conductive filament of the resistive switching memory device.

In a further embodiment, the present disclosure provides a resistive switching device. The resistive switching device can comprise a bottom electrode disposed upon a semiconductor substrate and a resistive switching material disposed above the bottom electrode comprising an aluminum and nitrogen material: $AlN_y$. Further, the resistive switching device can comprise a conductor material disposed above the resistive switching material comprising an aluminum and nitrogen material: $AlN_x$, wherein $y>x$ and a top electrode disposed above the conductor material.

In another embodiment, provided is a resistive switching device. The resistive switching device can comprise a bottom electrode disposed overlying a semiconductor substrate and a switching medium overlying the bottom electrode. Further, the switching medium can comprise a resistive switching material formed of a metal and nitrogen material: $MN_y$, where y is a positive number. The switching medium can additionally comprise a conductor material in contact with the resistive switching material and comprising a second metal and nitrogen material: $MN_x$, wherein x is a positive number and $y>x$. The resistive switching device can additionally comprise a top electrode disposed above the switching medium.

In a further embodiment, provided is a method for forming a semiconductor device. The method can comprise forming a bottom electrode overlying a substrate and forming, in a vacuum sealed environment having a first nitrogen atmospheric concentration, a first metal nitride material. The method can further comprise changing the first nitrogen atmospheric concentration of the vacuum sealed environment to a second nitrogen atmospheric concentration and forming, in the vacuum sealed environment having the second nitrogen atmospheric concentration, a second metal nitride material having a different percentage of nitrogen than the first metal nitride material. In addition, the method can comprise forming a top electrode overlying the second metal nitride material.

In additional embodiments, the subject disclosure provides a method for forming a semiconductor device. The method can comprise forming a bottom electrode upon a semiconductor substrate and forming a resistive switching material layer above the bottom electrode comprising an aluminum and nitrogen material: AlNy. Further, the method can comprise forming a conductor material above the resistive switching material comprising an aluminum and nitrogen material: AlNx, wherein y>x and forming a top electrode above the conductor material.

In still another embodiment, a method is provided for fabricating a resistive switching memory device. The method can comprise disposing a semiconductor substrate within a processing chamber and forming a bottom electrode overlying the semiconductor substrate. Moreover, the method can comprise sealing the processing chamber from an ambient atmosphere and while the processing chamber is sealed from the ambient atmosphere: forming an AlNy material overlying the bottom electrode within a controlled argon gas and nitrogen gas atmosphere associated with a first flow rate for nitrogen gas and forming an AlNx material within a second controlled argon gas and nitrogen gas atmosphere associated with a second flow rate for nitrogen gas, wherein the first flow rate is not equal to the second flow rate. In addition, the method can comprise unsealing the processing chamber from the ambient atmosphere.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
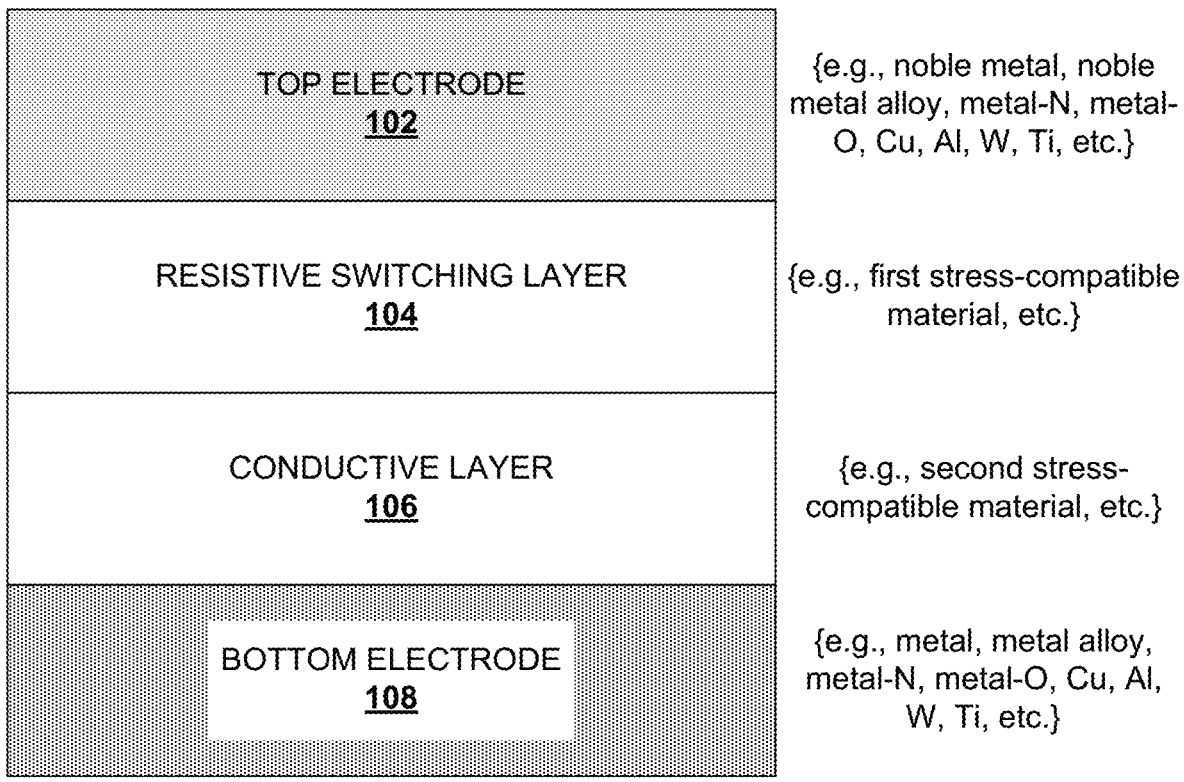
FIG. 1 depicts a block diagram of an example structure providing a non-stoichiometric resistive memory device in various disclosed embodiments.

This disclosure relates to resistive-switching two-terminal memory devices and one or more process(es) for manufacturing such device(s). Resistive-switching two-terminal memory cells (also referred to as resistive-switching memory cells or resistive-switching memory), as utilized herein, comprise circuit components having two conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

For a non-volatile filamentary-based resistive switching memory cell, a resistive switching layer (RSL) can be selected to have sufficient physical defect sites therein so as to trap particles in place in the absence of a suitable external stimulus, mitigating particle mobility and dispersion. This trapping of conductive particles, in response to a suitable program voltage applied across the memory cell, can cause a conductive path or a filament to form through an inherently electrically resistive RSL. In particular, upon application of a programming bias voltage, metallic ions are generated (e.g., from an adjacent active metal layer or in part within the RSL) that migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer (e.g., between particles or between the filament and an adjacent conductive layer).

In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., resistive states of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

Based upon the Inventors extensive experiments, they have come to believe that compressive/tensile forces between layers of resistive switching devices may have an undesirable effect upon long-term storage performance of resistive switching devices they have invented. Accordingly, in various embodiments, the inventors desire that the materials for a resistive switching device, such as a top electrode, a resistive switching material, a conductive material, and a bottom electrode are somewhat compatible in terms of composition and/or compressive or tensile stresses. As merely an example, in some embodiments a conductive layer may be a relatively-conductive metal nitride, or the like, and a switching layer may be a relatively-resistive metal nitride (e.g. ceramic), or the like, respectively.

The inventors have conducted controlled fabrication of resistive switching devices utilizing a variety of metal nitrides, and have discovered a combination of materials that enables a working resistive switching device expected to have high long term reliability. The use and success of aluminum nitride, as one example, as a resistive switching material has been a surprise to the inventors because most metal nitrides are highly conductive and are thus unsuitable as a switching material.

Referring now to the drawings, FIG. 1 illustrates a block diagram of an example resistive switching memory device 100 according to one or more embodiments. Resistive switching memory device can comprise a top electrode 102, a resistive switching layer 104, a conductive layer 106 and a bottom electrode 108. In various embodiments, one or more other layers can be provided for inter-layer adhesion, conductivity, mitigation of particle diffusion, or the like (e.g., see FIG. 3, infra).

In one or more embodiments, resistive switching memory device 100 can include a conductive layer 106 having a composition of AlNx and an adjacent switching layer 104 having a composition of AlNy. The conductive layer may have a ratio between the metal (e.g. Aluminum) and nitride (MNx) within the range of about 55:45 to about 80:20. Accordingly, in some embodiments, x may be within a range of about 0.80 to about 0.25. Further, in various embodiments, the switching layer 104 may have a ratio between the metal (e.g. Aluminum) and nitride (MNy) within the range of about 50:50 to about 40:60. Accordingly, in some embodiments, y may be within a range of about 1.00 to about 1.50. As can be seen, in some embodiments the relationship of y versus x is: y>x. In various embodiments, based upon measurements, it is believed that the conductive layer 106 may have an electrical resistance on the order of about 1 Kohm to about 100 Kohm, and the resistive switching layer 104 may have an initial resistance on the order of 1 Mohms or greater.

In some embodiments, conductive layer 106 and resistive switching layer 108 can be formed from the same elements (although as compounds with different proportions). As a result, it is expected that the compressive or tensile nature of these layers will be similar. In light of this, it is expected that a conductive filament formed within the switching material layer will be subject to less mechanical stress (e.g., compressive stress, tensile stress, etc.) in response to repeated heating and cooling. Accordingly, the reliability of such a resistive switching device over many program and erase operations is expected to increase.

In further embodiments, use of a metal nitride for conductive layer 106 can provide conductive material (e.g., particles, atoms, ions, etc.) for filament formation within resistive switching layer 104. Further the metal nitride can also provide the benefit of a built-in current compliance for the resistive switching device (e.g., based on the electrical resistance of the metal nitride). In some embodiments, switching material for resistive switching layer 104 may be AlNy and the conductive material for conductive layer 106 may be AlNx, y>x, as discussed above. In light of the above, it should be understood that other combinations of switching material and conductive material are within embodiments of the present invention. For example metal oxides, e.g. conductive AlOx and switching AlOy, where x<y, may also be used. Other suitable materials known to one of skill in the art, or made known by way of the context provided herein, are considered within the scope of the present disclosure.

Figure 2:
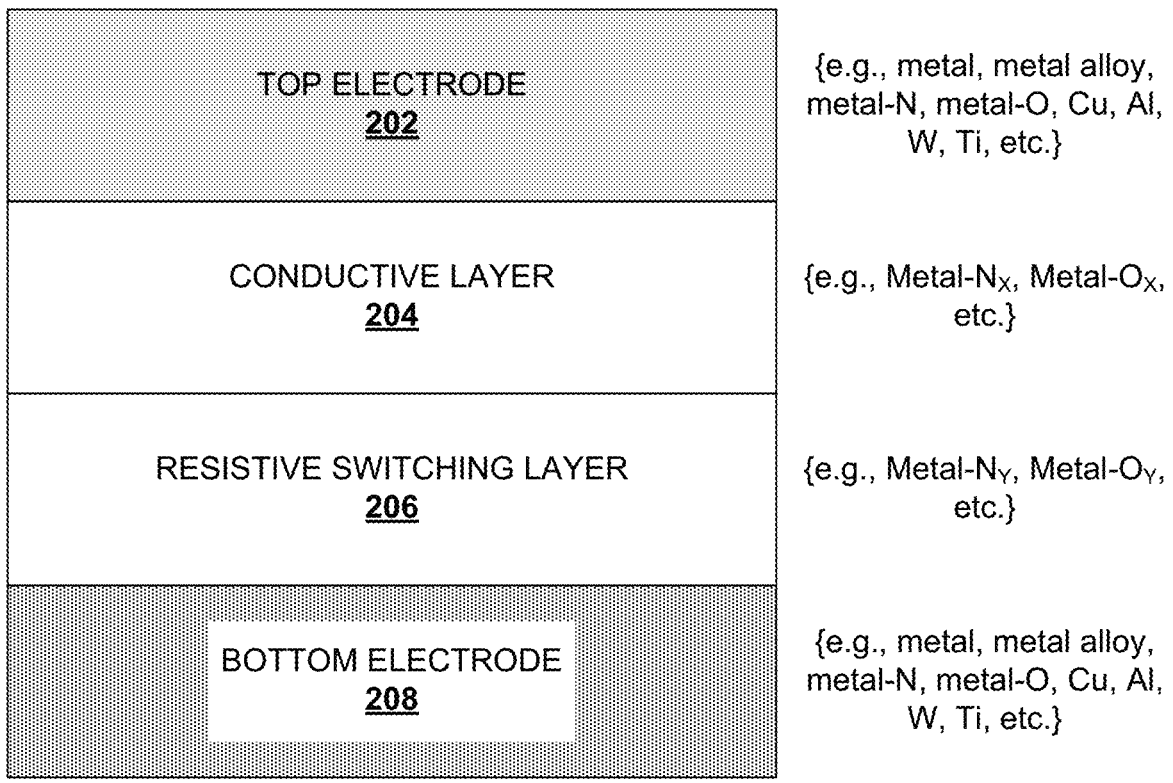
FIG. 2 illustrates a block diagram of a sample non-stoichiometric resistive switching memory device in alternative disclosed embodiments.

FIG. 2 illustrates a block diagram of a resistive switching memory device 200 according to an alternative embodiment of the present disclosure. Resistive switching memory device 200 can comprise a top electrode 202, conductive layer 204, resistive switching layer 206 and bottom electrode 208. Top electrode 202 and bottom electrode 208 can be made of suitable conductive materials. Examples of materials for top electrode 202 or bottom electrode 208 can comprise a metal, a metal alloy, metal nitride or metal oxide, Cu, Al, Ti, W and other suitable conductors. In some embodiments, top electrode 202 or bottom electrode 208 can comprise a conductive semiconductor material (e.g., doped Si, doped polysilicon, and so forth). Conductive layer 204 can comprise a metal nitride or metal oxide having a first concentration, x, of nitride or oxide. Further, resistive switching layer can comprise a metal nitride or metal oxide having a second concentration, y, of nitride or oxide. In various embodiments, y>x.

Figure 3:
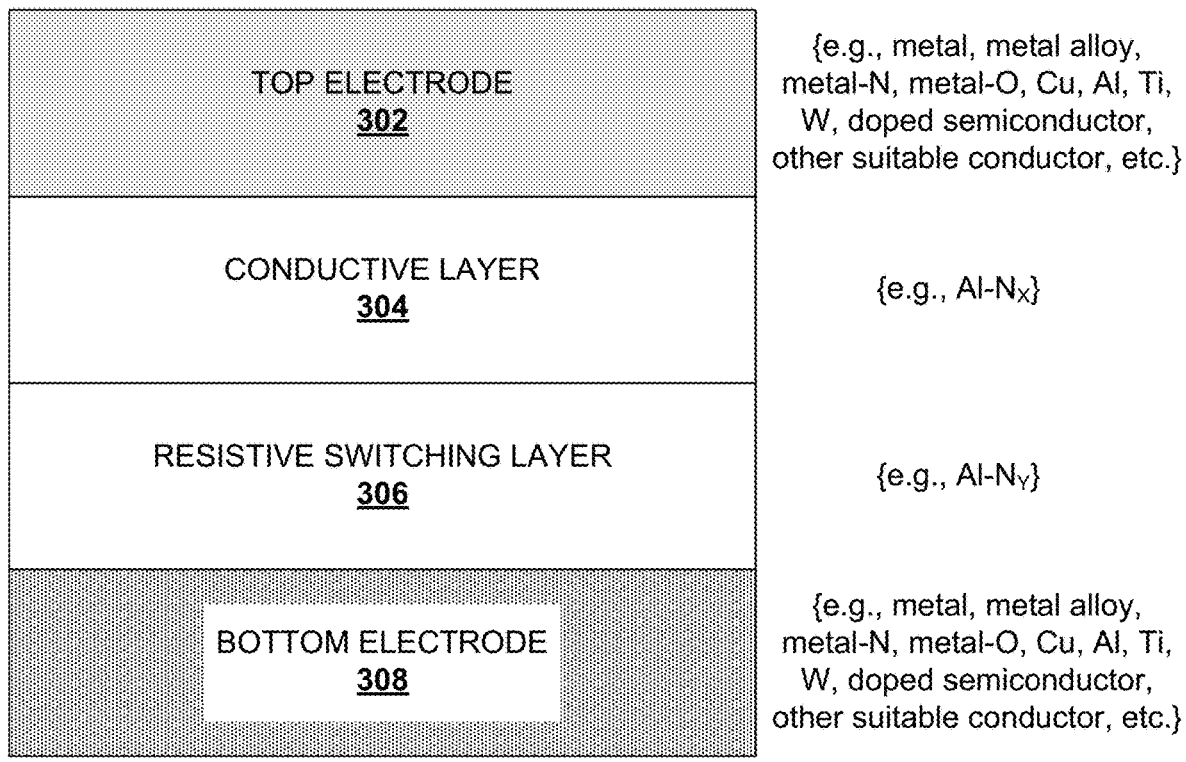
FIG. 3 depicts a block diagram of a sample structure providing a non-stoichiometric resistive memory device in other embodiments.

FIG. 3 illustrates a block diagram of an example memory device 300 according to further embodiments of the present disclosure. Memory device 300 can comprise multiple layers of aluminum nitride in various embodiments. In some embodiments, the layers of aluminum nitride can have disparate concentrations of nitrogen, disparate electrical resistances, or the like, or a suitable combination thereof.

Memory device 300 can comprise a bottom electrode 308 formed of a suitable electrical conductor. Example electrical conductors can include a metal, a metal alloy, a metal-nitride, a metal-oxide, Cu, Al, W or Ti or an alloy of the foregoing, a doped semiconductor, another suitable conductor, or a suitable combination of the foregoing. In at least one embodiment, bottom electrode 308 can be a similar material as conductive layer 304 or resistive switching layer 306 (e.g., an Al—N material or another metal nitride MN).

Resistive switching layer 306 is formed of Al—N material. In various embodiments, resistive switching layer 306 can have a ratio of aluminum to nitrogen within a range from about 50:50 to about 40:60. In some embodiments, the ratio of aluminum to nitrogen can be selected to yield an inherent electrical resistivity of about 1 mega ohms (Mohms) or greater (e.g., within a range of about 1 Mohm to about 100 Mohm). The Al—N material employed for resistive switching layer 306 is referred to as Al—$N_Y$ where Y is a positive number selected within a range of about 1.00 to about 1.50 in some embodiments. Conductive layer 304 is formed of a second Al—N material, referred to as Al—$N_X$, where X is a positive number different from Y. In some embodiments, the Al—$N_X$ material can have a ratio of aluminum to nitrogen within a second range from about 55:45 to about 80:20. In one or more embodiments, the second range can be selected to yield an inherent electrical resistivity of about 1 kilo ohm (Kohm) to about 100 Kohms. X can be a positive number selected within a range from about 0.25 to about 0.80. In some embodiments, resistive switching layer 306 can have a thickness within a range from about 2 nm to about 20 nm, and conductive layer 304 can have a thickness within a range from about 4 nm to about 100 nm. In one or more embodiments, resistive switching layer 306 and conductive layer 304 can be flipped in orientation (e.g., conductive layer 304 being between bottom electrode 308 and resistive switching layer 306, the latter being between conductive layer 304 and top electrode 302).

Further to the above, memory device 300 can comprise a top electrode 302 formed of a suitable electrical conductor. Top electrode 302 can include a metal, a metal alloy, a metal-nitride, a metal-oxide, Cu, Al or Ti or an alloy of the foregoing, a doped semiconductor, another suitable conductor, or a suitable combination of the foregoing. In at least one embodiment, top electrode 302 can be a similar material as conductive layer 304 or resistive switching layer 306 (e.g., an Al—N material or another metal nitride MN).

Figure 4:
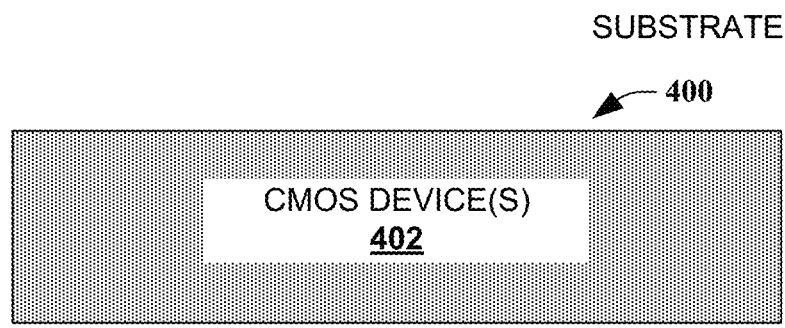
FIGS. 4-9 illustrate respective block diagrams of an example process for fabricating a disclosed memory device, in some embodiments.
Figure 5:
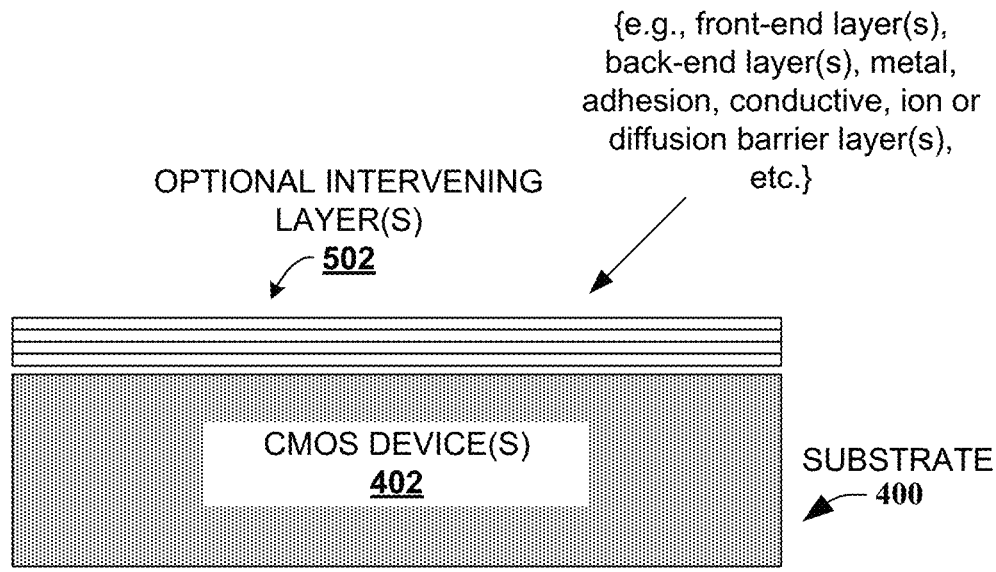

FIGS. 4-9 illustrate block diagrams of an example process method for fabricating a memory device according to one or more embodiments of the present disclosure. Referring to FIG. 4, a substrate 400 can be provided. Substrate 400 can be provided with one or more CMOS devices 402 formed therein, or the CMOS devices 402 can be fabricated as part of provision of substrate 400. With reference to FIG. 5, one or more optional layers 502 can be formed overlying substrate 400. The optional layers 502 can comprise a front-end layer(s) (e.g. active device layers, passive device layers, etc.), a back-end layer(s) (e.g., dielectric layers, metal wiring layers, interconnect layers, back-end active device layers, and so forth), a conductive layer(s) (e.g., metal, crystalline silicon, doped semiconductor, metal alloy, metal nitride, metal oxide, and so forth, or a suitable combination thereof), an adhesion layer(s) (e.g., Ti, TiN, Ta, TaN, W, WN, etc.), a diffusion barrier layer(s), an ion donor layer(s), or the like, or a suitable combination of the foregoing.

Figure 6:
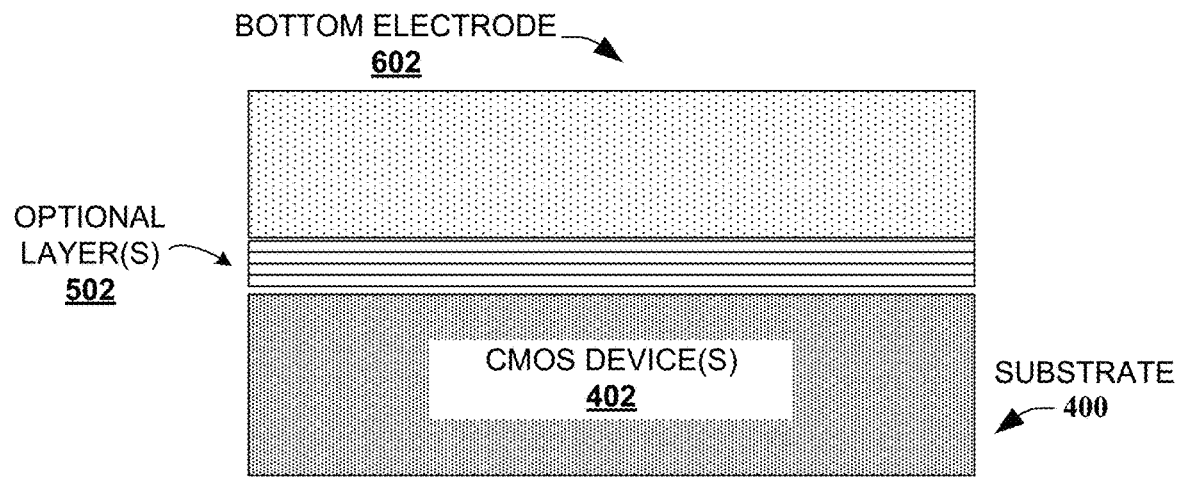
Figure 7:
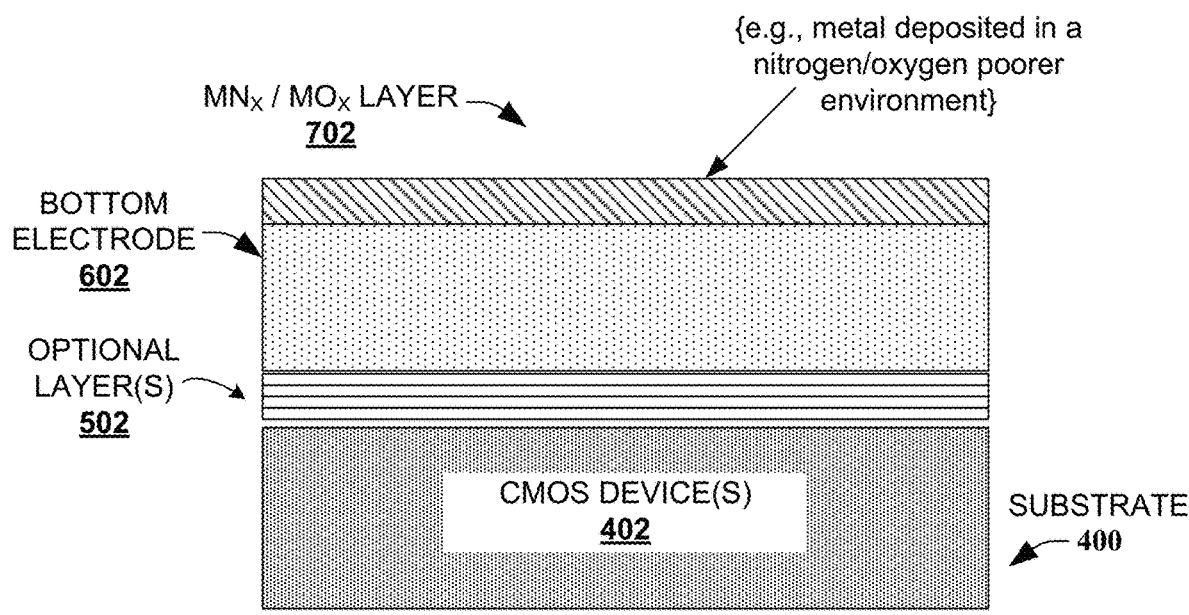

At FIG. 6, there is depicted a block diagram of a bottom electrode 602 formed overlying substrate 400 (and optional layer(s) 502, if formed). Bottom electrode 602 can be a suitable electrical conductor, as described herein or as known in the art. FIG. 7 illustrates a metal nitride or metal oxide layer 702 having a first concentration, X, of nitrogen to metal (also referred to as $MN_X/MO_X$ layer 702). $MN_X/MO_X$ layer 702 can be formed in a vacuum sealed chamber with a first nitrogen/oxygen concentration (e.g., a relatively small nitrogen/oxygen environment, or a relatively large nitrogen/oxygen environment). $MN_X/MO_X$ layer 702 can be formed with a thickness of about 2 nm to about 20 nm, in one or more embodiments.

Figure 8:
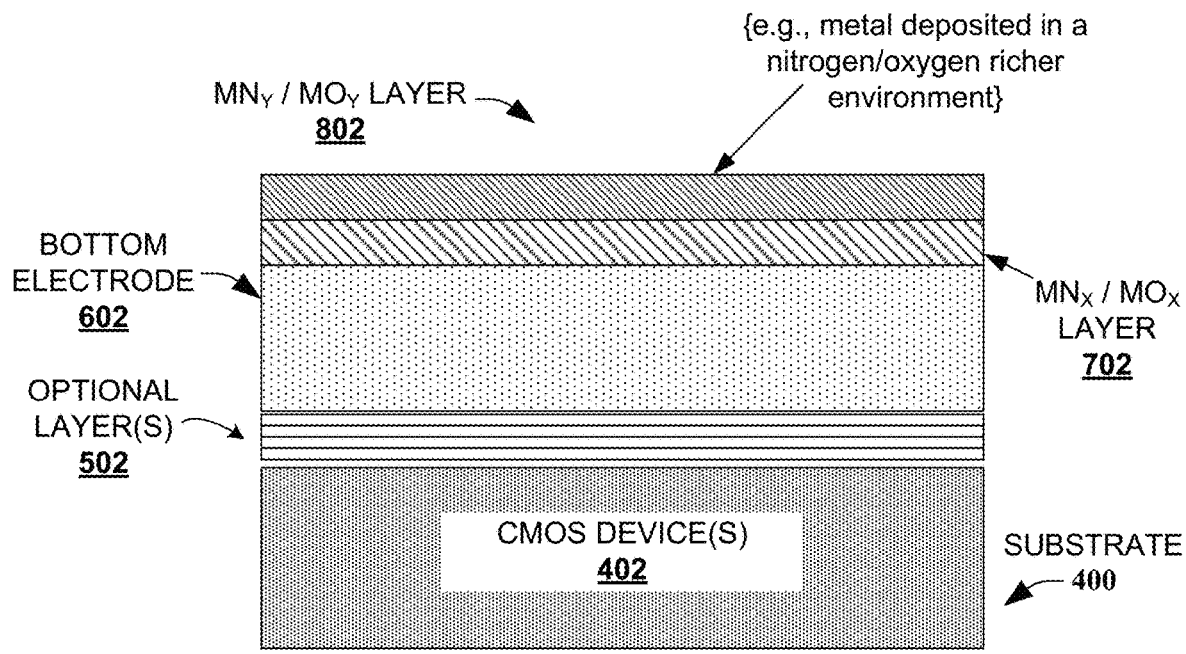

FIG. 8 depicts a block diagram of a second metal nitride or metal oxide layer 802 (also referred to as $MN_Y/MO_Y$ layer 802) overlying $MN_X/MO_X$ layer 702. $MN_Y/MO_Y$ layer 802 can be deposited in the vacuum sealed chamber with a second nitrogen/oxygen concentration, where Y>X. The $MN_Y/MO_Y$ layer 802 can be formed to a thickness of about 4 nm to about 100 nm, in various embodiments. In an embodiment, $MN_Y/MO_Y$ layer 802 can be formed below $MN_X/MO_X$ layer 702, rather than the order depicted by FIGS. 7 and 8.

Figure 9:
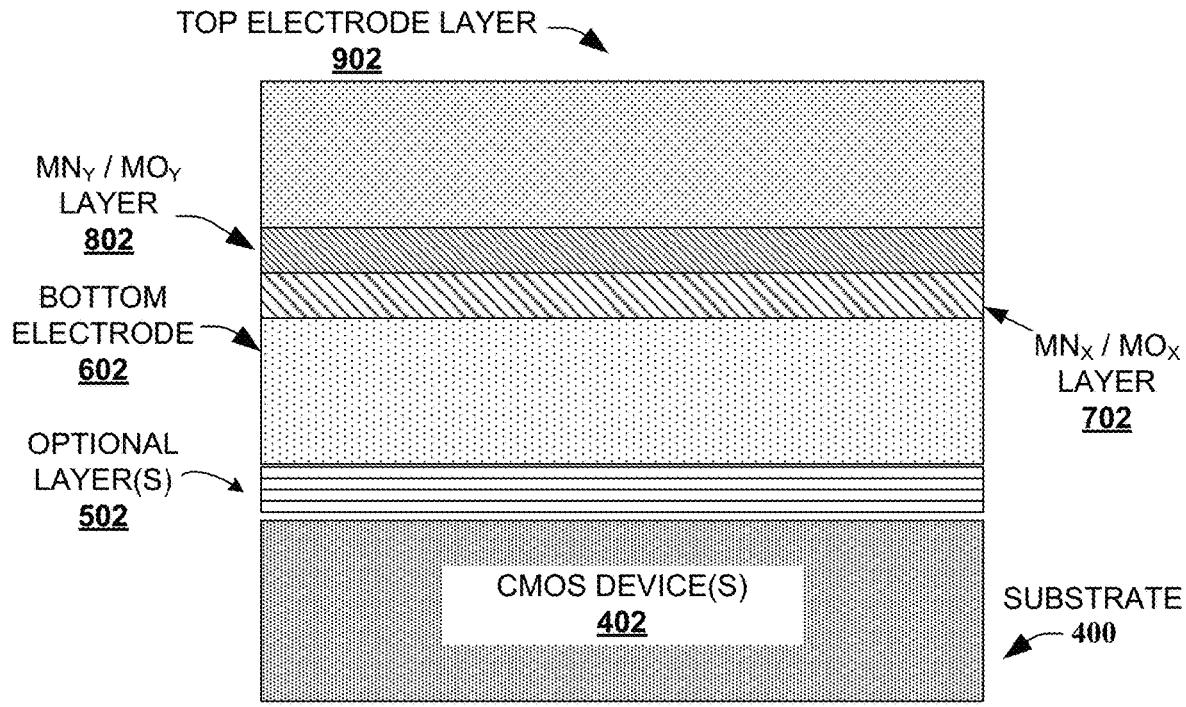

Referring to FIG. 9, there is illustrated a top electrode layer 902 formed overlying $MN_Y/MO_Y$ layer 802. Top electrode 902 can be a suitable electrical conductor, as described herein or as known in the art. Although not depicted, one or more additional optional layers (not depicted), such as described above at optional layer(s) 502, supra, can be provided between $MN_Y/MO_Y$ layer 802 and top electrode layer 902, in various embodiments.

Figure 10:
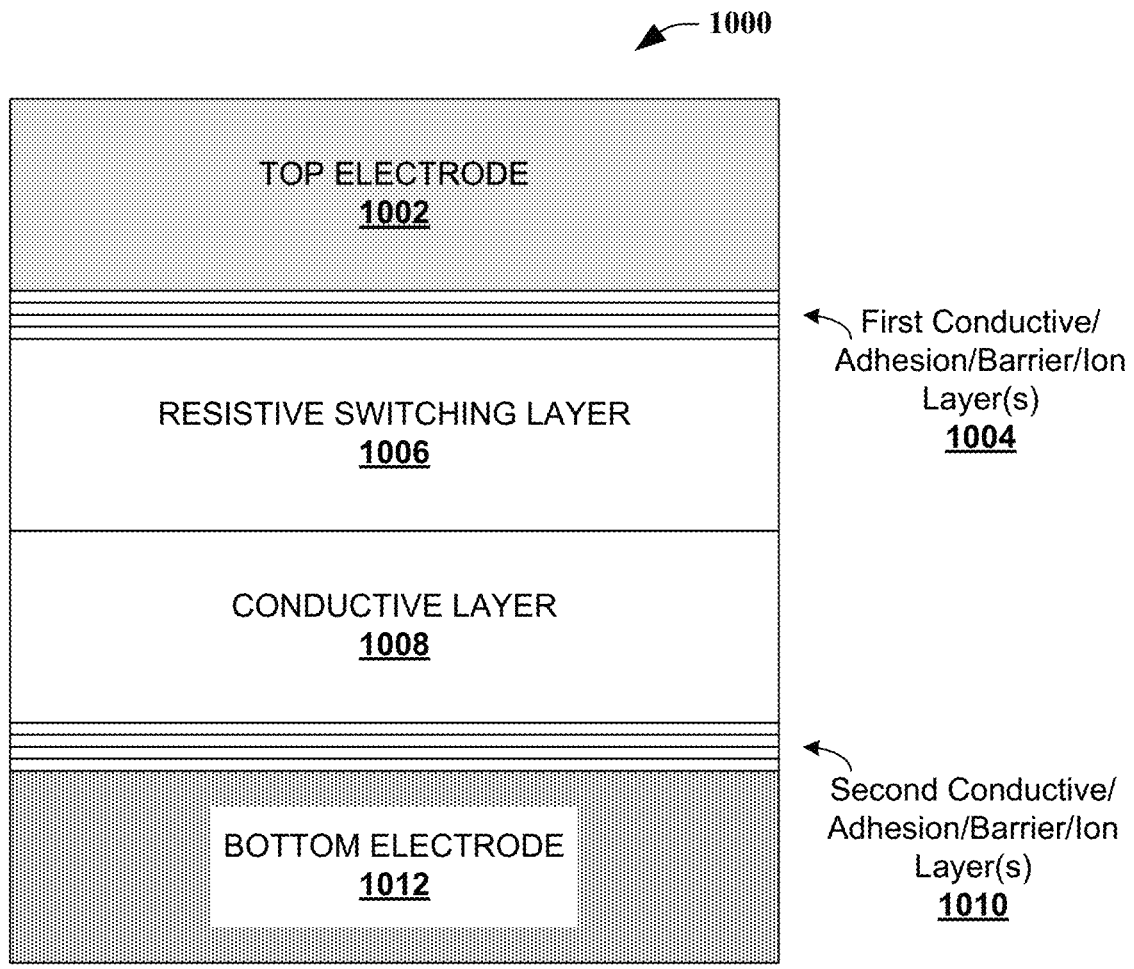
FIG. 10 depicts a block diagram of a sample resistive switching memory device according to still other disclosed embodiments.

FIG. 10 depicts a block diagram of a sample resistive switching memory device 1000 according to additional disclosed embodiments. Resistive switching memory device 1000 can comprise a top electrode 1002, resistive switching layer 1006, conductive layer 1008 and bottom electrode 1012 as described herein. Further, resistive switching memory device 1000 can comprise one or more additional layers or sets of layers. For instance, a first set of layers 1004 can comprise one or more of: a conductive layer for enhancing electrical conductivity between resistive switching layer 1006 and top electrode 1002, an adhesion layer for facilitating good inter-layer adhesion, a barrier layer for mitigating diffusion of particles (metals such as Cu, Al, O, or the like) between layers, or an ion layer for providing ions to another layer. In a further embodiment, resistive switching memory device can comprise a second set of layers 1010 including one or more of: a conductive layer, an adhesion layer, a barrier layer or an ion layer between conductive layer 1008 and bottom electrode layer 1012.

The aforementioned diagrams have been described with respect to interaction between several components (e.g., layers) of a memory cell, a conductive or resistive switching layer thereof, or a memory architecture comprised of such memory cell. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 11:
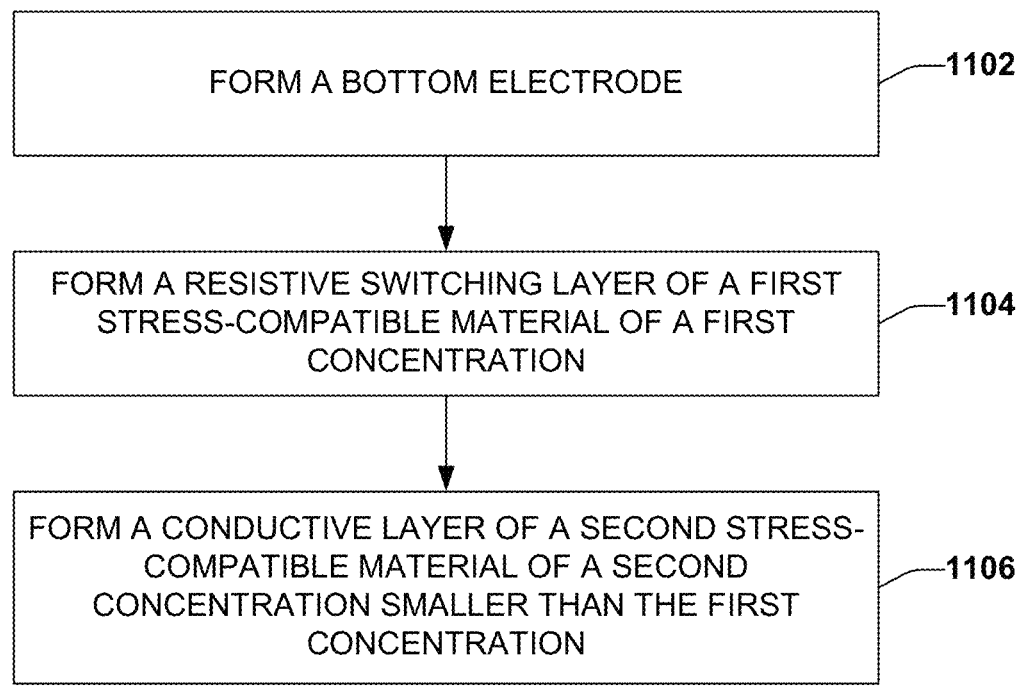
FIG. 11 illustrates a flowchart of a sample method of fabricating a resistive memory device in further embodiments.
Figure 12:
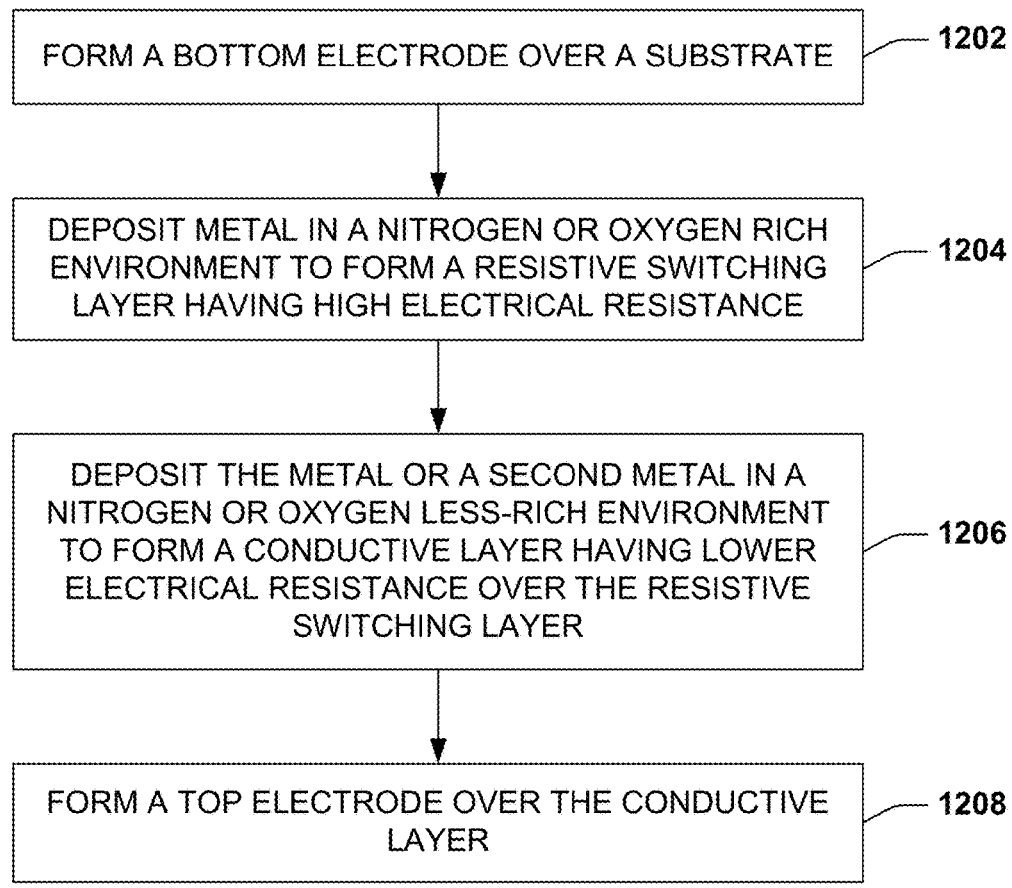
FIG. 12 depicts a flowchart of an example method of fabricating a non-stoichiometric memory device in additional embodiments.
Figure 13:
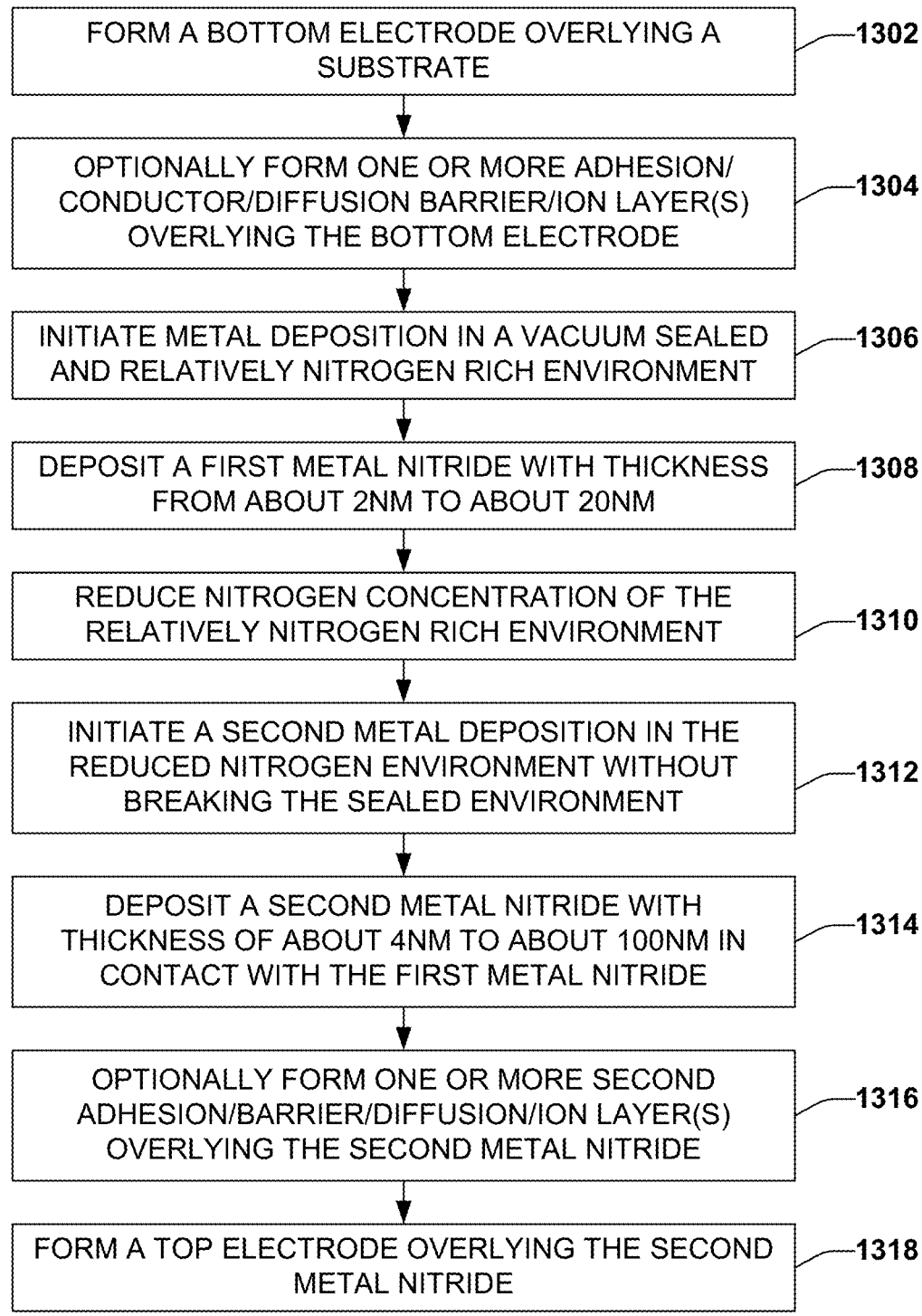
FIG. 13 illustrates a flowchart of a sample method of fabricating a non-stoichiometric memory device according to another embodiment.

In view of the exemplary diagrams described supra, process methods that can be implemented in accordance with the disclosed subject matter will be better appreciated with reference to the flow charts of FIGS. 11-13. While for purposes of simplicity of explanation, the methods of FIGS. 11-13 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 11 illustrates a flowchart of a sample method 1100 for forming a resistive switching memory device, according to one or more disclosed embodiments. At 1102, method 1100 can comprise forming a bottom electrode. The bottom electrode can be formed of a suitable conductive material, such as a metal, doped semiconductor, or the like. At 1104, method 1100 can comprise depositing (e.g., sputtering) a resistive switching layer of a first stress-compatible material of a first concentration. The first stress-compatible material can comprise a metal nitride in some embodiments, or a metal oxide in other embodiments. In an embodiment, the first stress-compatible material can be one part metal to a range from about 1.00 to about 1.50 parts nitride or oxide. In further embodiments, the resistive switching layer can be formed of a thickness within a range of about 2 nanometers (nm) to about 20 nm. At 1106, method 1100 can comprise depositing (e.g., sputtering) a conductive layer of a second stress-compatible material of a second concentration smaller than the first concentration. In an embodiment, the second stress-compatible material can be the same material as the first stress-compatible material. In various embodiments, the second stress-compatible material can be one part metal to a range from about 0.6 to about 0.8 parts nitride or oxide. In at least one embodiment, the conductive layer can be formed of a thickness within a range of about 4 nm to about 100 nm.

In various embodiments, for instance when both the conductive layer and the resistive switching layer are formed from the same materials, with different ratios, both layers may be fabricated in situ. In some embodiments, to form such a device, aluminum may be initially deposited (e.g. sputtered) within an argon and nitrogen-richer environment to form the resistive switching layer (with a thickness within a range of about 2 nm to about 20 nm), then without breaking the vacuum, aluminum may be deposited (e.g. sputtered) within an argon and nitrogen-poorer environment to form the conductive layer (with a thickness within a range of about 4 nm to about 100 nm). In other embodiments, two separate deposition processes may be used to form the two layers, with or without an air break. Materials for the top electrode and bottom electrode may also be a conductive nitride, such as a titanium nitride, tantalum nitride, aluminum nitride, or the like.

FIG. 12 illustrates a flowchart of a sample method 1200 according to further embodiments of the present disclosure. At 1202, method 1200 can comprise forming a bottom electrode over a substrate. At 1204, method 1200 can comprise depositing metal in a nitrogen or oxygen rich environment to form a resistive switching layer having high electrical resistance. At 1206, method 1200 can comprise depositing the metal or a second metal in a nitrogen or oxygen less-rich environment (e.g., compared to reference number 1204) to form a conductive layer having lower electrical resistance over the resistive switching layer. At 1208, method 1208 can comprise forming a top electrode over the conductive layer.

FIG. 13 depicts a flowchart of a sample method 1300 for fabricating a resistive memory device according to one or more additional embodiments of the present disclosure. At 1302, method 1300 can comprise forming a bottom electrode overlying a substrate. The substrate can comprise one or more CMOS devices, in various embodiments. In such embodiments, the bottom electrode (and other layers, provided below) can be formed within a thermal budget of the CMOS devices.

At 1304, method 1300 can comprise optionally forming one or more optional layers selected from a group consisting of: an adhesion layer, a diffusion barrier layer, a conductor layer, and an ion donor layer. In some embodiments, however, none of these layers can be formed. At 1306, method 1300 can comprise initiating metal deposition in a vacuum sealed and relatively nitrogen rich environment. At 1308, method 1300 can comprise depositing a first metal nitride layer. The first metal nitride layer can be formed to a thickness in a range from about 2 nm to about 20 nm in some embodiments. At 1310, method 1300 can comprise reducing nitrogen concentration of the relatively nitrogen rich environment to a relatively nitrogen poor environment. At 1312, method 1300 can comprise initiating a second metal deposition in the reduced nitrogen environment without breaking the vacuum seal. In various embodiments, the second metal deposition can comprise a common metal as the first metal deposition.

At 1314, method 1300 can comprise depositing a second metal nitride layer. The second metal nitride layer can be overlying and in contact with the first metal nitride layer. Moreover, the second metal nitride layer can be formed to have a thickness in a second range from about 4 nm to about 100 nm. At 1316, method 1300 can comprise optionally forming one or more second optional layers selected from the group consisting of: an adhesion layer, a diffusion barrier layer, a conductor layer and an ion donor layer. At 1318, method 1300 can comprise forming a top electrode overlying the second metal nitride layer.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 14 and 15, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

Figure 14:
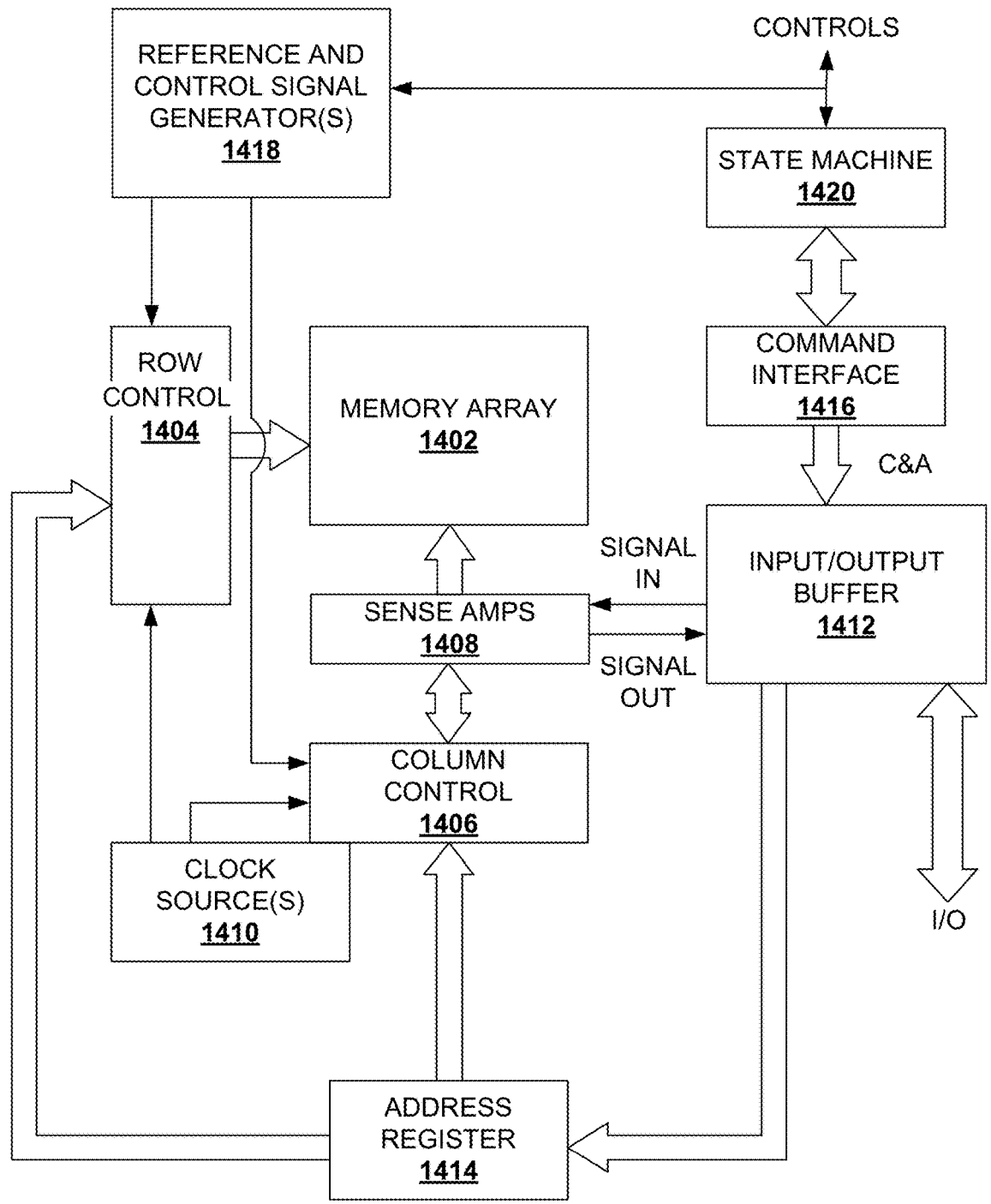
FIG. 14 depicts a block diagram of a sample operating and control environment for a memory device according to various disclosed embodiments.

FIG. 14 illustrates a block diagram of an example operating and control environment 1400 for a memory array 1402 of a memory cell array according to aspects of the subject disclosure. In at least one aspect of the subject disclosure, memory array 1402 can comprise memory selected from a variety of memory cell technologies. In at least one embodiment, memory array 1402 can comprise a two-terminal memory technology, arranged in a compact two or three dimensional architecture. Example architectures can include a 1T1R memory array, and a 1TnR memory array (or 1TNR memory array), as disclosed herein, where n is larger than 1. Suitable two-terminal memory technologies can include resistive-switching memory, conductive-bridging memory, phase-change memory, organic memory, magneto-resistive memory, or the like, or a suitable combination of the foregoing.

A column controller 1406 and sense amps 1408 can be formed adjacent to memory array 1402. Moreover, column controller 1406 can be configured to activate (or identify for activation) a subset of bit lines of memory array 1402. Column controller 1406 can utilize a control signal provided by a reference and control signal generator(s) 1418 to activate, as well as operate upon, respective ones of the subset of bitlines, applying suitable program, erase or read voltages to those bitlines. Non-activated bitlines can be kept at an inhibit voltage (also applied by reference and control signal generator(s) 1418), to mitigate or avoid bit-disturb effects on these non-activated bitlines.

In addition, operating and control environment 1400 can comprise a row controller 1404. Row controller 1404 can be formed adjacent to and electrically connected with word lines of memory array 1402. Also utilizing control signals of reference and control signal generator(s) 1418, row controller 1404 can select particular rows of memory cells with a suitable selection voltage. Moreover, row controller 1404 can facilitate program, erase or read operations by applying suitable voltages at selected word lines.

Sense amps 1408 can read data from, or write data to the activated memory cells of memory array 1402, which are selected by column control 1406 and row control 1404. Data read out from memory array 1402 can be provided to an input/output buffer 1412. Likewise, data to be written to memory array 1402 can be received from the input/output buffer 1412 and written to the activated memory cells of memory array 1402.

A clock source(s) 1408 can provide respective clock pulses to facilitate timing for read, write, and program operations of row controller 1404 and column controller 1406. Clock source(s) 1408 can further facilitate selection of word lines or bit lines in response to external or internal commands received by operating and control environment 1400. Input/output buffer 1412 can comprise a command and address input, as well as a bidirectional data input and output. Instructions are provided over the command and address input, and the data to be written to memory array 1402 as well as data read from memory array 1402 is conveyed on the bidirectional data input and output, facilitating connection to an external host apparatus, such as a computer or other processing device (not depicted, but see e.g., computer 1502 of FIG. 15, infra).

Input/output buffer 1412 can be configured to receive write data, receive an erase instruction, receive a status or maintenance instruction, output readout data, output status information, and receive address data and command data, as well as address data for respective instructions. Address data can be transferred to row controller 1404 and column controller 1406 by an address register 1410. In addition, input data is transmitted to memory array 1402 via signal input lines between sense amps 1408 and input/output buffer 1412, and output data is received from memory array 1402 via signal output lines from sense amps 1408 to input/output buffer 1412. Input data can be received from the host apparatus, and output data can be delivered to the host apparatus via the I/O bus.

Commands received from the host apparatus can be provided to a command interface 1416. Command interface 1416 can be configured to receive external control signals from the host apparatus, and determine whether data input to the input/output buffer 1412 is write data, a command, or an address. Input commands can be transferred to a state machine 1420.

State machine 1420 can be configured to manage programming and reprogramming of memory array 1402 (as well as other memory banks of a multi-bank memory array). Instructions provided to state machine 1420 are implemented according to control logic configurations, enabling state machine to manage read, write, erase, data input, data output, and other functionality associated with memory cell array 1402. In some aspects, state machine 1420 can send and receive acknowledgments and negative acknowledgments regarding successful receipt or execution of various commands. In further embodiments, state machine 1420 can decode and implement status-related commands, decode and implement configuration commands, and so on.

To implement read, write, erase, input, output, etc., functionality, state machine 1420 can control clock source(s) 1408 or reference and control signal generator(s) 1418. Control of clock source(s) 1408 can cause output pulses configured to facilitate row controller 1404 and column controller 1406 implementing the particular functionality. Output pulses can be transferred to selected bit lines by column controller 1406, for instance, or word lines by row controller 1404, for instance.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 15:
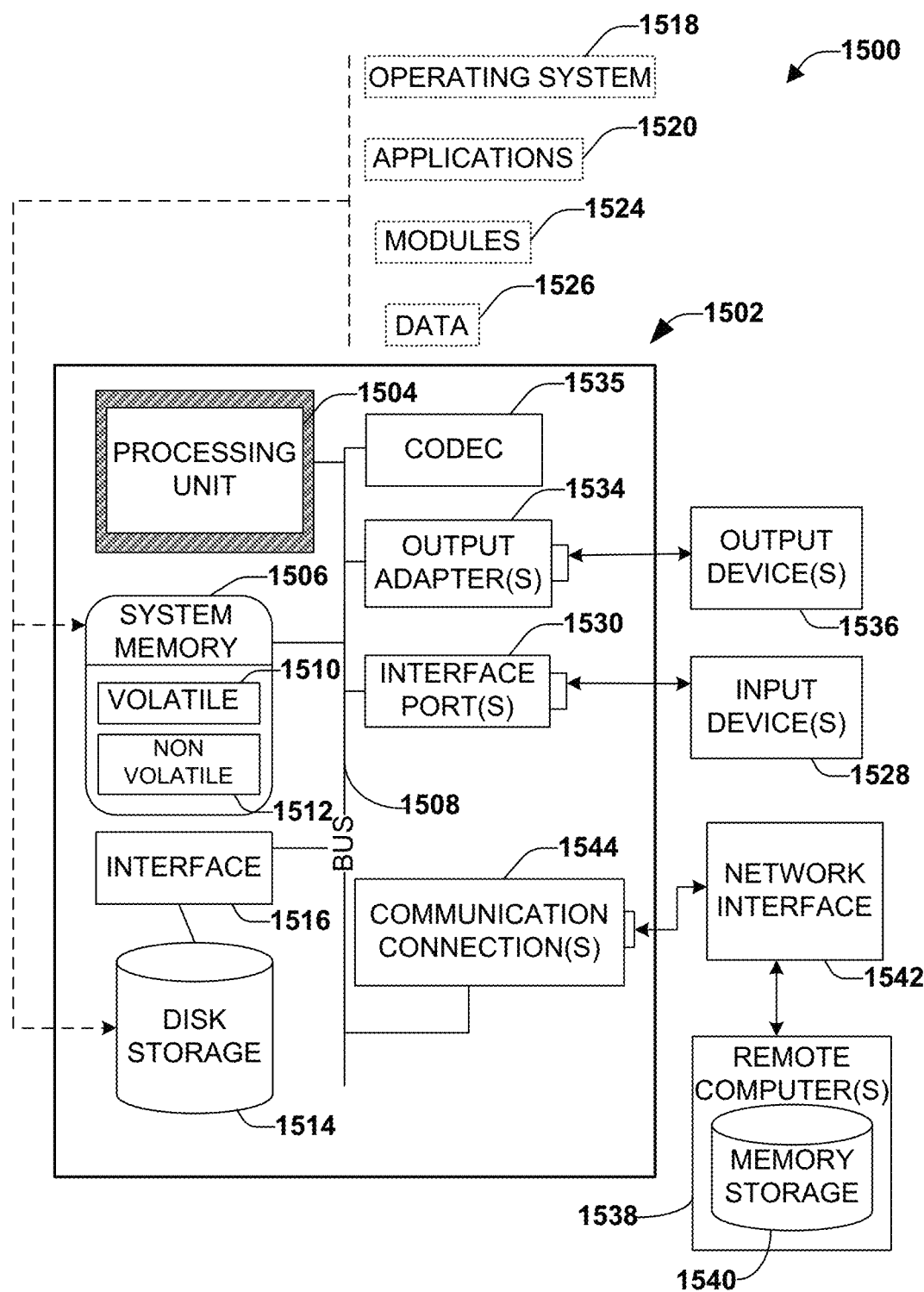
FIG. 15 illustrates a block diagram of an example computing environment that can be implemented in conjunction with various embodiments.

With reference to FIG. 15, a suitable operating environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1514, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to present innovations, codec 1535 may include at least one of an encoder or decoder, wherein the at least one of an encoder or decoder may consist of hardware, software, or a combination of hardware and software. Although, codec 1535 is depicted as a separate component, codec 1535 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or Flash memory. Non-volatile memory 1512 can employ one or more of the disclosed memory architectures, in at least some disclosed embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1502 may also include removable/non-removable, volatile/non-volatile computer storage medium. FIG. 15 illustrates, for example, disk storage 1514. Disk storage 1514 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1514 to the system bus 1508, a removable or non-removable interface is typically used, such as interface 1516. It is appreciated that disk storage 1514 can store information related to a user. Such information might be stored at or provided to a server or to an application running on a user device. In one embodiment, the user can be notified (e.g., by way of output device(s) 1536) of the types of information that are stored to disk storage 1514 and/or transmitted to the server or application. The user can be provided the opportunity to opt-in or opt-out of having such information collected and/or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port may be used to provide input to computer 1502, and to output information from computer 1502 to an output device 1536. Output adapter 1534 is provided to illustrate that there are some output devices, such as monitors, speakers, and printers, among other output devices, which require special adapters. The output adapter 1534 can include, by way of illustration and not limitation, video and sound cards that provide a means of connection between the output device 1536 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1544 refers to the hardware/software employed to connect the network interface 1542 to the system bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A resistive switching device, comprising:
    a bottom electrode disposed overlying a semiconductor substrate;
    a switching medium overlying the bottom electrode, the switching medium comprising:
        a resistive switching material formed of a first non-stoichiometric compound that consists of a metal and nitrogen material defined by a first chemical formula: $MN_y$, where y is a positive number greater than 1 and less than about 1.5, wherein the resistive switching material is configured to maintain a first resistance state or a second resistance state having different electrical resistance from the first resistance state;
        a conductor material in contact with the resistive switching material and comprising a second compound that consists of the metal and nitrogen material defined by a second chemical formula: $MN_x$, wherein x is a positive number and y>x, and wherein the conductor material supplies ions of the metal M to the resistive switching material in response to an electric stimulus applied to the resistive switching device, the supplied ions of the metal M facilitating transition from a high resistance state of the first resistance state or the second resistance state, to a low resistance state of the first resistance state or the second resistance state; and
    a top electrode disposed above the switching medium.

2. The resistive switching device of claim 1, wherein the metal is Aluminum and the first compound is aluminum nitride.

3. The resistive switching device of claim 1, wherein $MN_x$ is a non-stoichiometric metal nitride, wherein x is within a range of about 0.20 to about 0.80.

4. The resistive switching device of claim 1, wherein the first compound defined by the first chemical formula: $MN_y$ has a first ratio of metal to nitrogen between about 50:50 and about 40:60; and
    wherein the second compound defined by the second chemical formula: $MN_x$ has a second ratio of metal to nitrogen between about 55:45, and about 80:20.

5. The resistive switching device of claim 1, wherein the resistive switching material has a thickness in a range from about 2 nm to about 20 nm.

6. The resistive switching device of claim 1, wherein the conductor material has a thickness in a range from about 4 nm to about 100 nm.

7. The resistive switching device of claim 1, wherein the first resistance state has a first electrical resistance within a range of about 1 mega-ohms (MOhms) to about 100 MOhms.

8. The resistive switching device of claim 7, wherein the conductor material has an electrical resistance within a range from about 1 kilo-ohms (KOhms) to about 100 KOhms.

9. The resistive switching device of claim 8, wherein the second resistance state has a second electrical resistance approximately equal to or less than the electrical resistance of the conductor material.

10. The resistive switching device of claim 1, wherein the bottom electrode comprises materials selected from a group consisting of: copper, tungsten, titanium nitride and tantalum nitride.

11. The resistive switching device of claim 1, wherein the top electrode or the bottom electrode comprise a material selected from a group consisting of: a metal, a metal nitride, a metal oxide, a metal alloy, Cu, a Cu alloy, Al, an Al alloy, Ti, or a Ti alloy.

* * * * *